(12) United States Patent
Narui et al.

(10) Patent No.: US 10,964,702 B2
(45) Date of Patent: Mar. 30, 2021

(54) SEMICONDUCTOR DEVICE WITH FIRST-IN-FIRST-OUT CIRCUIT

(71) Applicant: Micron Technology, Inc., Boise, ID (US)

(72) Inventors: Seiji Narui, Sagamihara (JP); Yuki Ebihara, Chofu (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/163,471

(22) Filed: Oct. 17, 2018

(65) Prior Publication Data

US 2020/0126993 A1  Apr. 23, 2020

(51) Int. Cl.
| | | |
|---|---|---|
| *G06F 5/06* | (2006.01) | |
| *H01L 27/108* | (2006.01) | |
| *G11C 11/4074* | (2006.01) | |
| *G11C 19/08* | (2006.01) | |
| *G11C 19/28* | (2006.01) | |

(52) U.S. Cl.
CPC ......... *H01L 27/10814* (2013.01); *G06F 5/06* (2013.01); *G11C 11/4074* (2013.01); *G11C 19/0875* (2013.01); *G11C 19/287* (2013.01)

(58) Field of Classification Search
CPC ... G11C 11/4074; G11C 8/00; G11C 19/0875; G11C 19/188; G11C 19/287; H01L 27/10814; G06F 5/06
See application file for complete search history.

(56) References Cited

U.S. PATENT DOCUMENTS

| | | | |
|---|---|---|---|
| 4,365,247 A | | 12/1982 | Bargeton et al. |
| 5,272,675 A | * | 12/1993 | Kobayashi ............. G06F 5/06 365/189.05 |
| 5,274,593 A | | 12/1993 | Proebsting |
| 5,331,320 A | | 7/1994 | Cideciyan et al. |
| 5,999,458 A | * | 12/1999 | Nishimura ........... G11C 7/1006 365/189.05 |
| 6,032,248 A | | 2/2000 | Curry et al. |

(Continued)

FOREIGN PATENT DOCUMENTS

| | | |
|---|---|---|
| CN | 105190585 A | 12/2015 |
| CN | 107993684 A | 5/2018 |

(Continued)

OTHER PUBLICATIONS

PCT App. No. PCT/US2018/023629 entitied 'Semiconductor Layered Device With Data Bus' filed Mar. 21, 2018

(Continued)

*Primary Examiner* — Khamdan N. Alrobaie
(74) *Attorney, Agent, or Firm* — Dorsey & Whitney LLP

(57) ABSTRACT

Apparatuses including a first-in first-out circuit are described. An example apparatus includes: a first-in first-out circuit including a first latch, a second latch and a logic circuit coupled in series. The first latch receives first data and latches the first data responsive to a first input pointer signal. The second latch receives the latched first data from the first latch and latches the received first data responsive to a second input pointer signal that has a different phase from the first input pointer signal and thus provides a second data. The logic circuit receives the second data and an output pointer signal and further provides an output data responsive to the output pointer signal.

20 Claims, 13 Drawing Sheets

(56) References Cited

U.S. PATENT DOCUMENTS

| | | | |
|---|---|---|---|
| 6,115,301 A | 9/2000 | Namekawa | |
| 6,307,794 B1 | 10/2001 | Haga | |
| 6,333,915 B1 | 12/2001 | Fujita | |
| 6,367,027 B1* | 4/2002 | Frankowsky | G06F 5/06 |
| | | | 713/600 |
| 6,518,893 B1 | 2/2003 | Robinson | |
| 6,741,190 B2 | 5/2004 | Henkel et al. | |
| 6,747,625 B1* | 6/2004 | Han | G09G 3/3688 |
| | | | 345/100 |
| 6,844,833 B2 | 1/2005 | Cornelious et al. | |
| 6,963,220 B2 | 11/2005 | Momtaz et al. | |
| 7,113,550 B2 | 9/2006 | Stonecypher et al. | |
| 7,405,981 B2 | 7/2008 | Dietrich | |
| 7,501,963 B1 | 3/2009 | Hollis | |
| 7,551,167 B2 | 6/2009 | Park et al. | |
| 7,616,133 B2 | 11/2009 | Hollis | |
| 7,701,368 B2 | 4/2010 | Hollis | |
| 8,014,196 B2 | 9/2011 | Graef | |
| 8,018,358 B2 | 9/2011 | Hollis | |
| 8,026,740 B2 | 9/2011 | Hollis | |
| 8,094,045 B2 | 1/2012 | Hollis | |
| 8,207,976 B2 | 6/2012 | Hein | |
| 8,248,873 B2 | 8/2012 | Bae et al. | |
| 8,433,190 B2 | 4/2013 | Wellbrock et al. | |
| 8,762,813 B2 | 6/2014 | Tang et al. | |
| 8,766,828 B2 | 7/2014 | Hollis | |
| 8,854,236 B2 | 10/2014 | Hollis | |
| 8,879,654 B2 | 11/2014 | Hollis | |
| 9,025,409 B2 | 5/2015 | Shaeffer | |
| 9,048,856 B2 | 6/2015 | Hollis | |
| 9,091,727 B1 | 7/2015 | Lupu et al. | |
| 9,116,828 B2 | 8/2015 | Hollis | |
| 9,148,170 B2 | 9/2015 | Hollis | |
| 9,268,719 B2 | 2/2016 | Shaeffer | |
| 9,336,383 B2 | 5/2016 | Salamat et al. | |
| 9,798,693 B2 | 10/2017 | Hollis | |
| 9,983,925 B2 | 5/2018 | Dono et al. | |
| 10,146,719 B2 | 12/2018 | Kondo et al. | |
| 2003/0170020 A1 | 9/2003 | Chaudhuri et al. | |
| 2004/0109509 A1 | 6/2004 | Stonecypher et al. | |
| 2004/0135709 A1 | 7/2004 | Cornelius et al. | |
| 2005/0288642 A1 | 12/2005 | Kim | |
| 2007/0096950 A1 | 5/2007 | Yang et al. | |
| 2007/0226430 A1* | 9/2007 | Dietrich | G11C 7/1096 |
| | | | 711/154 |
| 2008/0225603 A1 | 9/2008 | Hein | |
| 2008/0247501 A1* | 10/2008 | Zhang | G06F 5/08 |
| | | | 377/70 |
| 2009/0119419 A1 | 5/2009 | Bae et al. | |
| 2009/0179782 A1 | 7/2009 | Hollis | |
| 2009/0190690 A1 | 7/2009 | Kuwata | |
| 2009/0238300 A1 | 9/2009 | Hollis | |
| 2009/0313521 A1 | 12/2009 | Hollis | |
| 2010/0026533 A1 | 2/2010 | Hollis | |
| 2010/0027989 A1 | 2/2010 | Lewis et al. | |
| 2010/0199017 A1 | 8/2010 | Hollis | |
| 2011/0018517 A1 | 1/2011 | Candage et al. | |
| 2011/0116786 A1 | 5/2011 | Wellbrock et al. | |
| 2011/0222623 A1 | 9/2011 | Hollis | |
| 2011/0252171 A1 | 10/2011 | Dearth et al. | |
| 2011/0316726 A1 | 12/2011 | Hollis | |
| 2012/0131244 A1 | 5/2012 | Abbasfar | |
| 2012/0195131 A1 | 8/2012 | Pax | |
| 2012/0206280 A1 | 8/2012 | Abbasfar et al. | |
| 2012/0221927 A1 | 8/2012 | Moon | |
| 2012/0224430 A1 | 9/2012 | Visconti et al. | |
| 2013/0307708 A1 | 11/2013 | Hollis | |
| 2014/0053040 A1 | 2/2014 | Hargan | |
| 2014/0281075 A1 | 9/2014 | Hollis | |
| 2014/0289460 A1 | 9/2014 | Shu et al. | |
| 2014/0313062 A1 | 10/2014 | Hollis | |
| 2015/0022383 A1 | 1/2015 | Hollis | |
| 2015/0287446 A1 | 10/2015 | Hong | |
| 2015/0324261 A1 | 11/2015 | Hollis | |
| 2016/0141010 A1 | 5/2016 | Yun | |
| 2016/0173128 A1 | 6/2016 | Ware et al. | |
| 2016/0293231 A1 | 10/2016 | Shu et al. | |
| 2016/0364348 A1 | 12/2016 | Shu | |
| 2017/0337951 A1 | 11/2017 | Hollis et al. | |
| 2018/0277175 A1 | 9/2018 | Kondo et al. | |
| 2019/0034370 A1 | 1/2019 | Kondo et al. | |
| 2019/0361835 A1* | 11/2019 | Ebihara | G11O 5/04 |

FOREIGN PATENT DOCUMENTS

| | | |
|---|---|---|
| JP | 11-283396 | 10/1999 |
| KR | 20150060346 A | 6/2015 |
| TW | 201619836 A | 6/2016 |
| TW | 201812753 A | 4/2018 |
| WO | 2014151637 A1 | 9/2014 |
| WO | 2018175634 A1 | 9/2018 |
| WO | 202008131 A1 | 4/2020 |

OTHER PUBLICATIONS

U.S. Appl. No. 15/703,365, entitled "Apparatuses and Methods for Performing Intra-Module Databus Inversion Operations", filed Sep. 13, 2017.

Unpublished U.S. Appl. No. 15/233,821, filed Aug. 10, 2016.

U.S. Appl. No. 16/150,505, titled "Semiconductor Layered Device With Data Bus", filed Oct. 3, 2018.

U.S. Appl. No. 15/987,895, titled "Semiconductor Layered Device With Data Bus Inversion", filed May 23, 2018, pp. all.

Cheng, et al., ""Memory bus encoding for low power: a tutorial"", Quality Electronic Design, 2001 International Symposium on Mar. 26-28, 2001, Piscataway, NJ, USA, IEEE 26 Mar. 2001, pp. 199-204.

Hollis, "Data Bus Inversion in High-Speed Memory Applications", IEEE Transactions on Circuits and Systems—II Express Briefs vol. 56, No. 4, Apr. 2009.

Rokhani, et al., "Low-Power Bus Transform Coding for Multilevel Signals", IEEE Asia Pacific Conference on Circuits and Systems, Dec. 2006, 1272-1275.

Shin, Youngsoo et al., "Partial Bus-Invert Coding for Power Optimization of Application-Specific Systems", IEEE Transactions on Very Large Scale Integration (VLSI) Systems, vol. 9, No. 2, Apr. 2001.

Stan, et al., "Bus-Invert Coding for Low-Power I/O", IEEE Transactions on Very Large Scale Integration vol. 3, No, 1, Mar. 1995, 49-58.

International Search Report and Written Opinion for Application No. PCT/US2019/056600, dated Feb. 4, 2020.

U.S. Appl. 16/840,281, titled "Semiconductor Layered Device With Data Bus Inversion" filed, Apr. 3, 2020.

English translation of TW Office Action Application No. 108115190, dated Feb. 21, 2020.

English translation of TW Office Action for Application No. 108135468, dated Aug. 31, 2020.

* cited by examiner

SEMICONDUCTOR DEVICE WITH FIRST-IN-FIRST-OUT CIRCUIT

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking chips (e.g., dies) vertically and interconnecting the chips using through substrate vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC), High Bandwidth Memory (HBM), and a wide-I/O dynamic random access memory (DRAM).

For example, High Bandwidth Memory (HBM) is a type of memory including a high-performance DRAM interface chip and vertically stacked DRAM chips. A typical HBM stack of four DRAM chips (e.g., core chips) has two 128-bit channels per chip for a total of eight input/output channels and a width of 1024 bits in total. An interface (IF) chip of the HBM provides an interface with the eight input/output channels, which function independently of each other. In the HBM, data transmission between chips (e.g., between an interface chip and core chips) via through substrate vias (TSVs) may cause high power consumption, due to current charge and discharge at the TSVs as capacitors.

Throughout a semiconductor device, in order to temporary store data while maintaining an order of a data, a first-in-first-out (FIFO) circuit is used. 3D memory devices (e.g., HBM and the like) support data bus inversion ("DBI") during write and read operation for reducing currents in data transmission between a host controller and chips (e.g., dies) via a data bus. One of DBI algorithms, DBI-AC algorithm, is used to limit the number of simultaneously transitioning data bits (e.g., a half of bits or fewer) across the width of the interface. Under the DBI-AC algorithm, all the bits of current data to be transmitted are inverted in logic level prior to transmission of the current data, if a majority of bits of the current data are different in logic level from previous data (e.g., immediately preceding data) transmitted one data transmission cycle before the current data without inversion. If the previous data was transmitted with inversion, however, the current data is transmitted as is, even if the majority of bits of the current data are different in logic level from the previous data. DBI calculation is performed to detect whether the majority bits of the current data are different in logic level from the previous data. Based on the majority bits' transitions based on the DBI calculation result and previous execution status of the DBI operation, a DBI bit indicating whether the DBI is executed on the current data. Since the DBI calculation involves data comparison of the current data with the previous data, FIFO circuits are included in the 3D memory devices.

FIG. 1A is a circuit diagram of a First-In-First-Out (FIFO) circuit 10 including a plurality of flip-flop (FF) circuits 11a to 11d according to the prior art. FIG. 1B is a circuit diagram of an FF circuit 110 according to the prior art. For example, the FF circuit 110 may be each FF circuit of the plurality of FF circuits 11a to 11d. For example, The FF circuit 110 may include three inverters 111-113 and four clocked inverters 114-117. The plurality of FF circuits 11a to 11d are coupled in series, as shown in FIG. 1A. FIG. 1C is a timing diagram of signals in the FIFO circuit according to the prior art. The signals include an input signal at a data input node Din, a clock signal CLK, FF output signals ff0, ff1, ff2 from the FF circuits 11a, 11b, 11c, and an output signal at a data output node Dout. The plurality of FF circuits 11a to 11d conveys data received serially from the data input node Din of the FIFO circuit 10 that is coupled to a data input node D of the FF circuit 11a to the data output node Dout of the FIFO circuit 10 that is coupled to a data output node Q of the FF circuit 11d, by periodically alternating a signal level of the clock signal CLK provided to the plurality of FF circuits 11a to 11d, while maintaining a transmission order of the data. By increasing a number of FF circuits of the plurality of FF circuits, more data can be stored in the FIFO circuit 10. However, increasing the number of the FF circuits also increases power consumption to convey a clock signal CLK to run the FF circuits as well as a layout area of the FIFO circuit 10.

Alternatively, a plurality of latch circuits have been used in a First-In-First-Out (FIFO) circuit. FIG. 2A is a circuit diagram of a First-In-First-Out (FIFO) circuit 20 including a plurality of latch circuits 21a to 21d according to the prior art. In the FIFO circuit 20, the plurality of latch circuits 21a to 21d are coupled in parallel between a data input node Din of the FIFO circuit 20 and a data output node Dout of the FIFO circuit 20 in order to suppress a layout area and power consumption. The FIFO circuit 20 also includes a plurality of NAND circuits 22a to 22d coupled to output nodes of the latch circuits 21a to 21d, respectively. The FIFO circuit 20 further includes a NAND circuit 23 that receives output signals from the plurality of NAND circuits 22a to 22d and provides an output signal to the data output node Dout after executing a logic NAND operation. FIG. 2B is a circuit diagram of a latch circuit 210 according to the prior art. The latch circuit 210 is used as each of the latch circuits 21a, 21b, 21c and 21d. The latch circuit 210 includes two inverter circuits 215 and 216 and two clocked inverters 217 and 218.

In order to operate the latch circuits 21a, 21b, 21c and 21d in the FIFO circuit 20, pointer signals are provided. FIG. 2C is a circuit diagram of a pointer circuit 220 according to the prior art. The pointer circuit 220 provides input pointer signals ip0, ip1, ip2 and ip3 and output pointer signals op0, op1, op2 and op3. The pointer circuit 220 includes a plurality of flip-flop (FF) circuits 221-224, a plurality of NAND circuits 226-229 and a plurality of buffers 230-233, as shown in FIG. 2C. The plurality of flip-flop (FF) circuits 221-224 provide output signals p0-p1 to the plurality of NAND circuits 226-229 and the plurality of buffers 230-233, respectively. The plurality of NAND circuits 226-229 provide the ip0-ip3 signals that each has a pulse width of a half clock cycle responsive to the clock signal CLK. The plurality of buffers 230-233 provide the op0-op3 signals that each has a pulse width of one clock cycle responsive to the clock signal CLK. The latch circuits 21a to 21d operate latching functions (e.g., storing input signals and providing the input signals responsive to timing signals) of an input signal from the data input node Din and provide lat0 to lat3 signals, respectively. Because the plurality of NAND circuits 22a, 22b, 22c and 22d receive lat0 to lat3 signals and the op3, op0, op1, op2 signals respectively, the plurality of NAND circuits 22a, 22b, 22c and 22d operate logic NAND operations between the lat0, lat1, lat2 and lat3 signals and the op3, op0, op1, op2 signals that have an active pulse three clock cycles after an (negative) active pulse of the ip0, ip1, ip2, ip3 respectively, and the NAND circuits 22a, 22b, 22c and 22d may provide output signals with a delay of three clock cycles with respect the lat0 to lat3 signals. In the FIFO circuit 220 of FIG. 2C, the ip0 to ip3 signals and the op0 to op3 signals are generated from the identical clock signal CLK; however, the ip0 to ip3 signals and the op0 to op3 signals can be generated by using two separate clock signals.

When a data width (i.e. a number of data bits) is small, including a pointer circuit is not effective and advantageous. On the other hand, including a pointer circuit in a FIFO circuit with a great data width (i.e., a number of data bits) is advantageous because reduction of FIFO circuit layout area and power consumption overweighs an additional area occupied by the pointer circuit. Increasing the number of data to be stored can be achieved by increasing the number of latch circuits to be coupled in parallel to one another in the FIFO circuit; however, a number of input and output pointer signals also increases. Moreover, including data converters between serial data and parallel data with a greater number of logic stages to process data conversion of a great data width causes more processing load. Thus, increasing the number of either FF circuits or latch circuits to process data with a greater data width in the FIFO circuit causes a larger area and greater power consumption.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments of the disclosure may be practiced. The specification provides sufficient detail to enable those skilled in the art to practice embodiments of the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

Figure 3A:
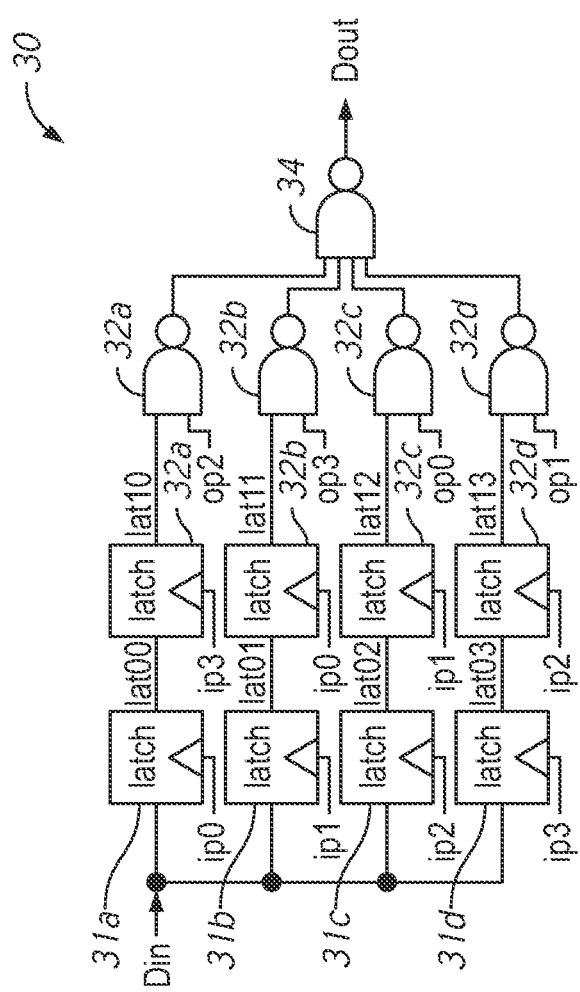
FIG. 3A is a circuit diagram of a First-In-First-Out (FIFO) circuit in accordance with an embodiment of the present disclosure.

FIG. 3A is a circuit diagram of a First-In-First-Out (FIFO) circuit 30 in accordance with an embodiment of the present disclosure. The FIFO circuit 30 may be in an apparatus that is a semiconductor device. The semiconductor device may be a 3D memory device such as include Hybrid Memory Cube (HMC), High Bandwidth Memory (HBM), and a wide-I/O dynamic random access memory (DRAM). The FIFO circuit 30 may include a first plurality of latch circuits 31a to 31d, a second plurality of latch circuits 32a to 32d and a plurality of NAND circuits 33a to 33d. The first plurality of latch circuits 31a to 31d and the second latch circuits 32a to 32d may be coupled in series between an input terminal (e.g., at a data input node Din) of the FIFO circuit 30 supplied with an input signal and one of input nodes of the plurality of NAND circuits 33a to 33d, respectively. The first plurality of latch circuits 31a to 31d may have input nodes coupled the data input node Din of the FIFO circuit 30. The first plurality of latch circuits 31a to 31d may also have clock nodes that receive input pointer signals ip0, ip1, ip2 and ip3 having different phases and output nodes that provide latched signals lat00, lat01l, lat02 and lat03 controlled by (e.g., responsive to an activation of) the input pointer signals ip0, ip1, ip2 and ip3, respectively. The second plurality of latch circuits 32a to 32d may have input nodes coupled to output nodes of the first plurality of latch circuits 31a to 31d and receive the latched signals lat00, lat01l, lat02 and lat03, respectively. The second plurality of latch circuits 32a to 32d may also have clock nodes that receive the input pointer signals ip3, ip0, ip1 and ip2 and output nodes that provide latched signals lat10, lat11, lat12 and lat13 controlled by (e.g., responsive to an activation of) the input pointer signals ip3, ip0, ip1 and ip2, respectively.

Figure 1C:
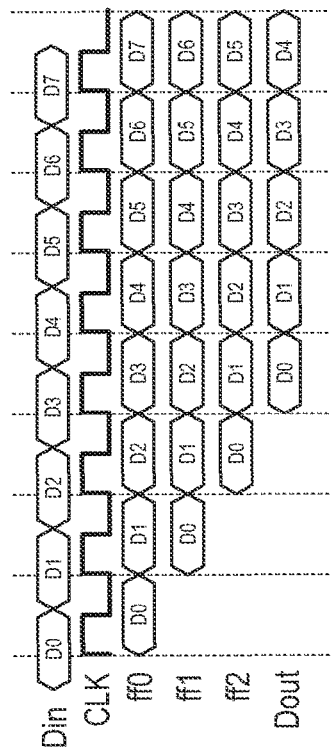
FIG. 1C is a timing diagram of signals in the FIFO circuit according to the prior art.
Figure 1A:
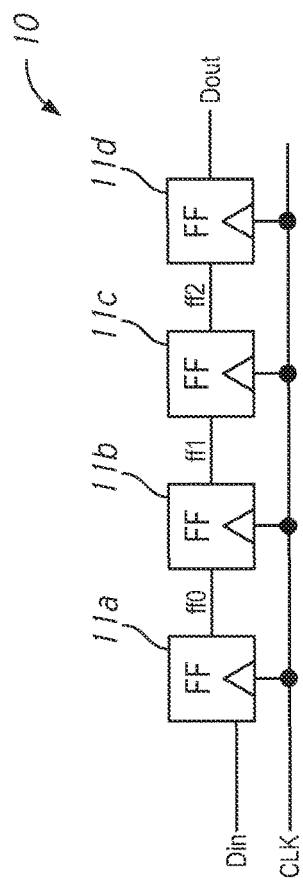
FIG. 1A is a circuit diagram of a First-In-First-Out (FIFO) circuit including a plurality of flip-flop (FF) circuits according to the prior art.
Figure 1B:
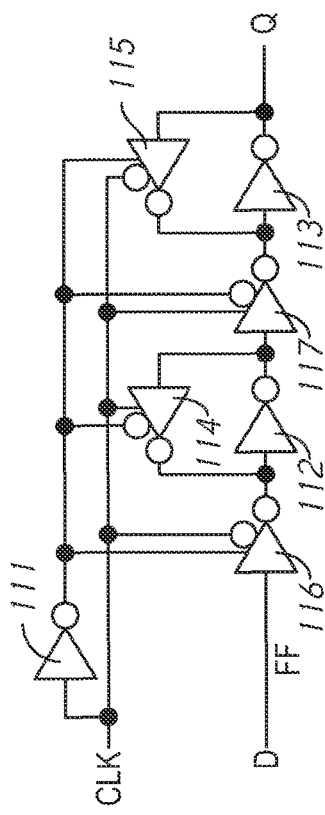
FIG. 1B is a circuit diagram of an FF circuit according to the prior art.
Figure 2A:
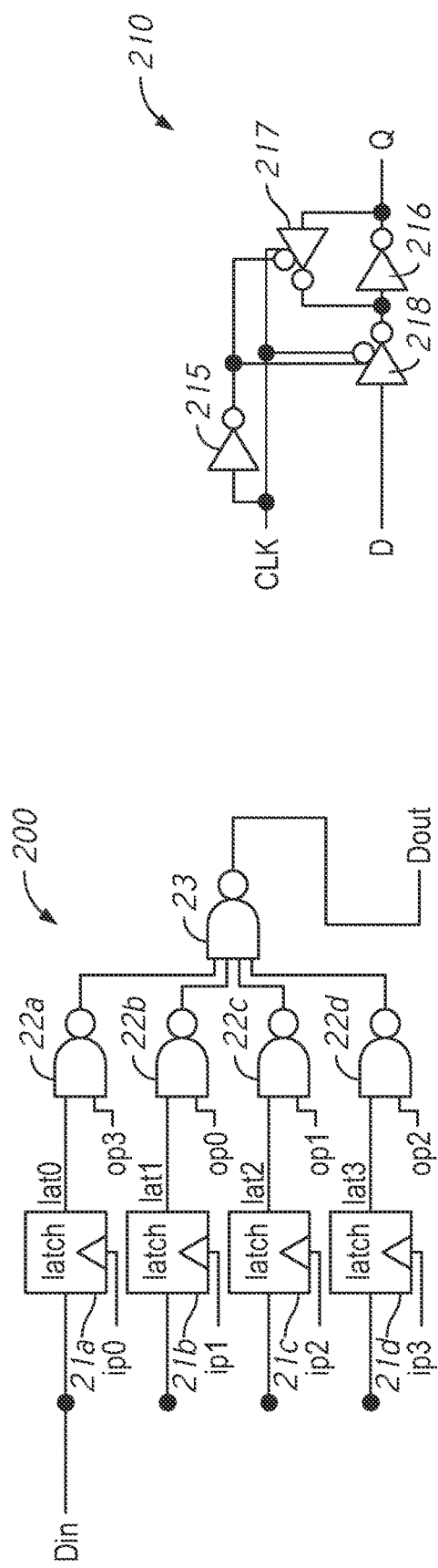
FIG. 2A is a circuit diagram of a First-In-First-Out (FIFO) circuit including a plurality of latch circuits according to the prior art.
Figure 2B:
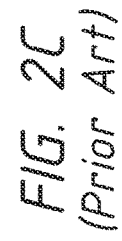
FIG. 2B is a circuit diagram of a latch circuit according to the prior art.

The plurality of NAND circuits 33a to 33d may have one of the input nodes coupled to output nodes of the second plurality of latch circuits 32a to 32d to receive the latched signals lat10, lat11, lat12, and lat13, respectively. The plurality of NAND circuits 33a to 33d may further have the other of the input nodes that may receive output pointer signals op2, op3, op0 and op1, having different phases, respectively. Thus, the plurality of NAND circuits 33a to 33d may provide (pass through) output signals controlled by (e.g., responsive to) the output pointer signals op2, op3, op0 and op1. The FIFO circuit 30 may further include a NAND circuit 34 that may receive output signals from the plurality of NAND circuits 33a to 33d, execute a logic NAND operation over the received signals (e.g., combine the received signals), and may further provide an output signal to the data output node Dout after executing the logic NAND operation. For example, the latch circuit 210 in FIG. 2B may be used as each latch circuit of the first plurality of latch circuits 31a to 31d and the second plurality of latch circuits 32a to 32d. However, any other structure of latch circuits may be used as the first plurality of latch circuits 31a to 31d and the second plurality of latch circuits 32a to 32d.

In order to operate the first plurality of latch circuits 31a to 31d, the second plurality of latch circuits 32a to 32d and the plurality of NAND circuits 33a to 33d in the FIFO circuit 20, pointer signals may be provided. For example, the pointer circuit 220 in FIG. 2C may be used to provide the input pointer signals ip0 to ip3 and the output pointer signals op0 to op3; however, the input pointer signals ip0 to ip3 and the output pointer signals op0 to op3 may be generated from separate two clock signals.

Figure 2C:
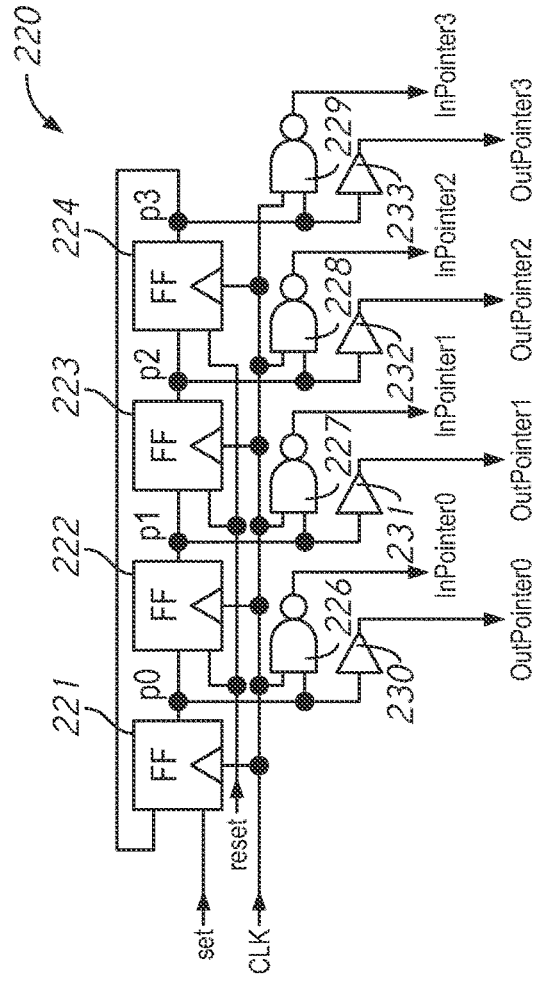
FIG. 2C is a circuit diagram of a pointer circuit according to the prior art.
Figure 3B:
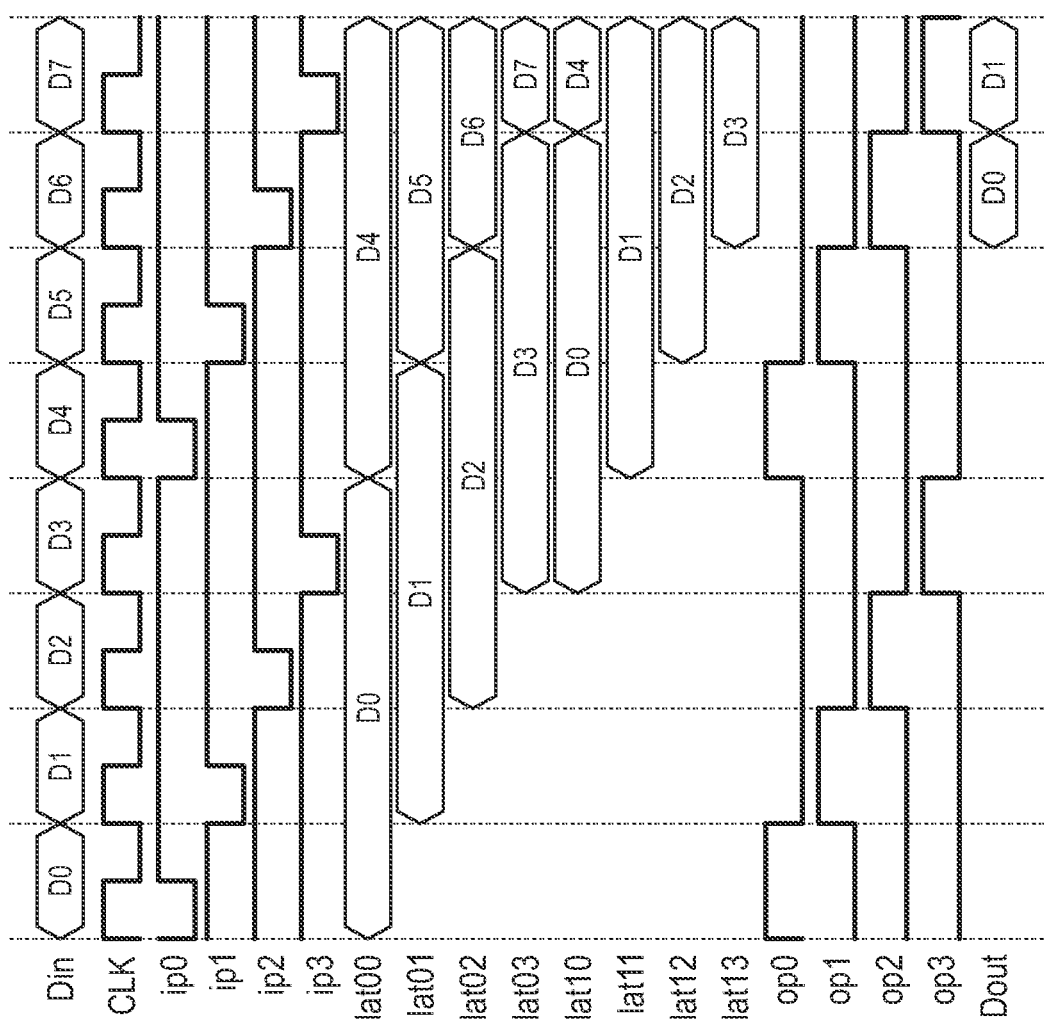
FIG. 3B is a timing diagram of signals in the FIFO circuit in accordance with an embodiment of the present disclosure.

FIG. 3B is a timing diagram of signals in the FIFO circuit 30 in accordance with an embodiment of the present disclosure. The first plurality of latch circuits 31a to 31d may operate latching functions of an input signal from the data input node Din by storing the input signal and providing lat00 to lat03 signals responsive to the input pointer signals ip0, ip1, ip2 ip3, respectively. As shown in FIG. 2C, feedback loop of the FF circuits 221-224 coupled in serial where an output node of the FF circuit 224 is coupled to an input node of the FF circuit 221 may provide the input pointer signals ip0 to ip3 that are cyclic pulse signals having a cycle of four clock cycles and a negative active pulse having a pulse width of a half clock cycle, where the input pointer signals ip1, ip2, ip3, ip0 have may different phases by having the negative active pulse with one clock cycle delay with respect to the input pointer signals ip0, ip1, ip2 and ip3 as shown in FIG. 3B. Here, the latch circuit 31a may receive the input pointer signal ip0 and the latch circuit 31b may receive the input pointer signal ip1 that has the negative active pulse after one clock of the negative active pulse of the input pointer signal ip0. Thus, the latch circuit 31a may latch the input signal at the data input node Din and the latch circuit 31b may latch the input signal after the latch circuit 31a.

Figure 2D:
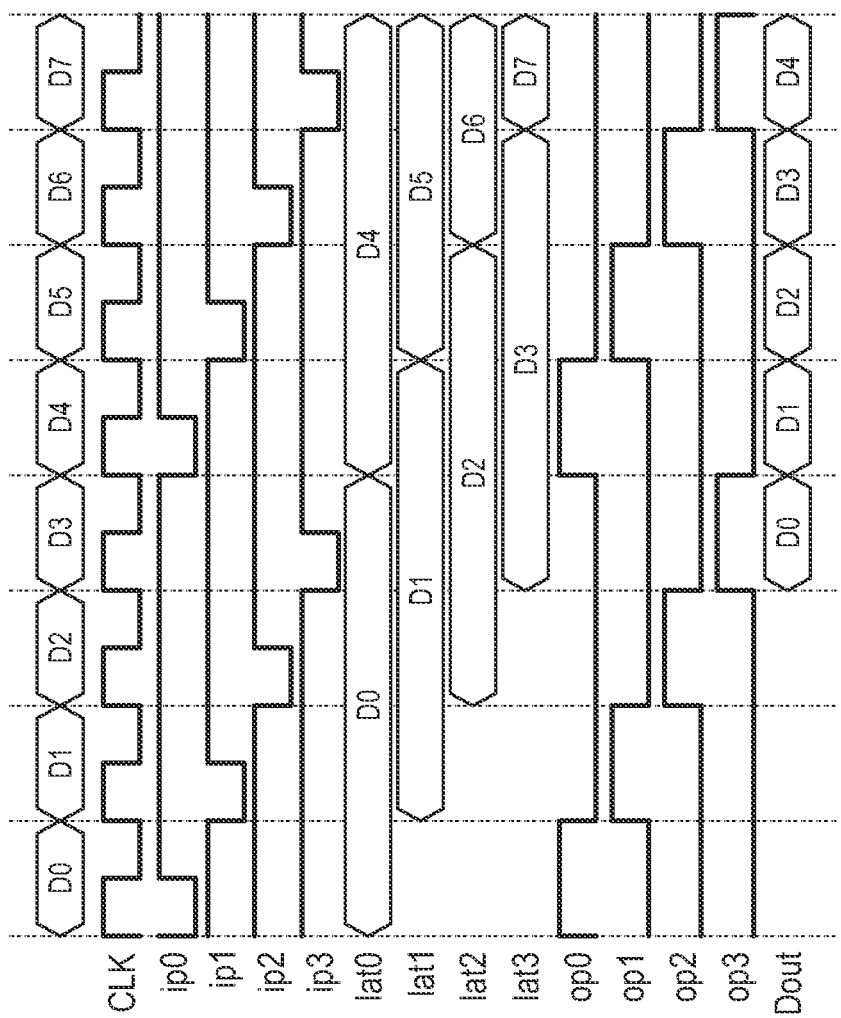
FIG. 2D is a timing diagram of signals in the FIFO circuit according to the prior art.

The second plurality of latch circuits 32a to 32d may operate latching functions of the received lat00 to lat03 signals by storing the lat00 to lat03 signals and providing the stored lat00 to lat03 signals as lat10 to lat13 signals responsive to the input pointer signals ip3, ip0, ip1, ip2, which have the negative active pulses three clock cycles after the negative active pulses of the input pointer signals ip0, ip1, ip2, ip3 respectively as shown in FIG. 3B. Here, the NAND circuit 33a may receive the lat10 signal responsive to the input pointer signal ip3 and the NAND circuit 33b may receive the lat11 signal responsive to the input pointer signal ip0 that transmits the negative active pulse having one clock cycle delay with respective to the negative active pulse of the input pointer signal ip3. The plurality of NAND circuits 33a, 33b, 33c and 33d may receive lat10 to lat13 signals and the output pointer signals op2, op3, op0, op1, that are cyclic pulse signals having a cycle of four clock cycles and a negative active pulse having a pulse width of one clock cycle, and a delay of three clock cycles after an (negative) active pulse of the ip3, ip0, ip1, ip2 respectively. The plurality of NAND circuits 33a, 33b, 33c and 33d may operate logic NAND operations between the lat10, lat11, lat12 and lat13 signals and the output pointer signals op3, op0, op1, op2 respectively, and the NAND circuits 33a, 33b, 33c and 33d provide output signals with a delay of three clock cycles with respect the lat10 to lat13 signals after the NAND operation of the output signals form the NAND circuits 33a to 33d by the NAND circuit 34. In the FIFO circuit 30 of FIGS. 3A and 3B, a number of clock cycles in a delay between the data input node Din and the data output node Dout may be about six cycles, as twice as much as the delay in FIG. 2D. Thus, the FIFO circuit 30 may store data on the input signal from the data input node Din for a period of six clock cycles of the clock signal CLK, that may be longer than the FIFO circuit 20 of FIG. 2A does (e.g., three cycles of the clock signal CLK), while using the same pointer signals ip0 to ip3 and op0 to op3 used for the FIFO circuit 20, such as the input pointer signals ip0 to ip3 and the output pointer signals op0 to op3 that can be provided by the pointer circuit 220 of FIG. 2C, without enhancement of the pointer circuit 220.

In a similar concept, a plurality of latch circuits, more than two latch circuits disclosed the above, may be coupled in series between the data input node Din and each of the NAND circuits 33a, 33b, 33c and 33d. Also, the number of stages coupled in parallel is not limited to four, such as a stage of the latch circuits 31a, 32a and the NAND circuit 33a, a stage of the latch circuits 31b, 32b and the NAND circuit 33b, a stage of the latch circuits 31c, 32c, and the NAND circuit 33c, and a stage of the latch circuits 31d, 32d, and the NAND circuit 33d, where a number of different pointer signals from each other can be provided.

Figure 4:
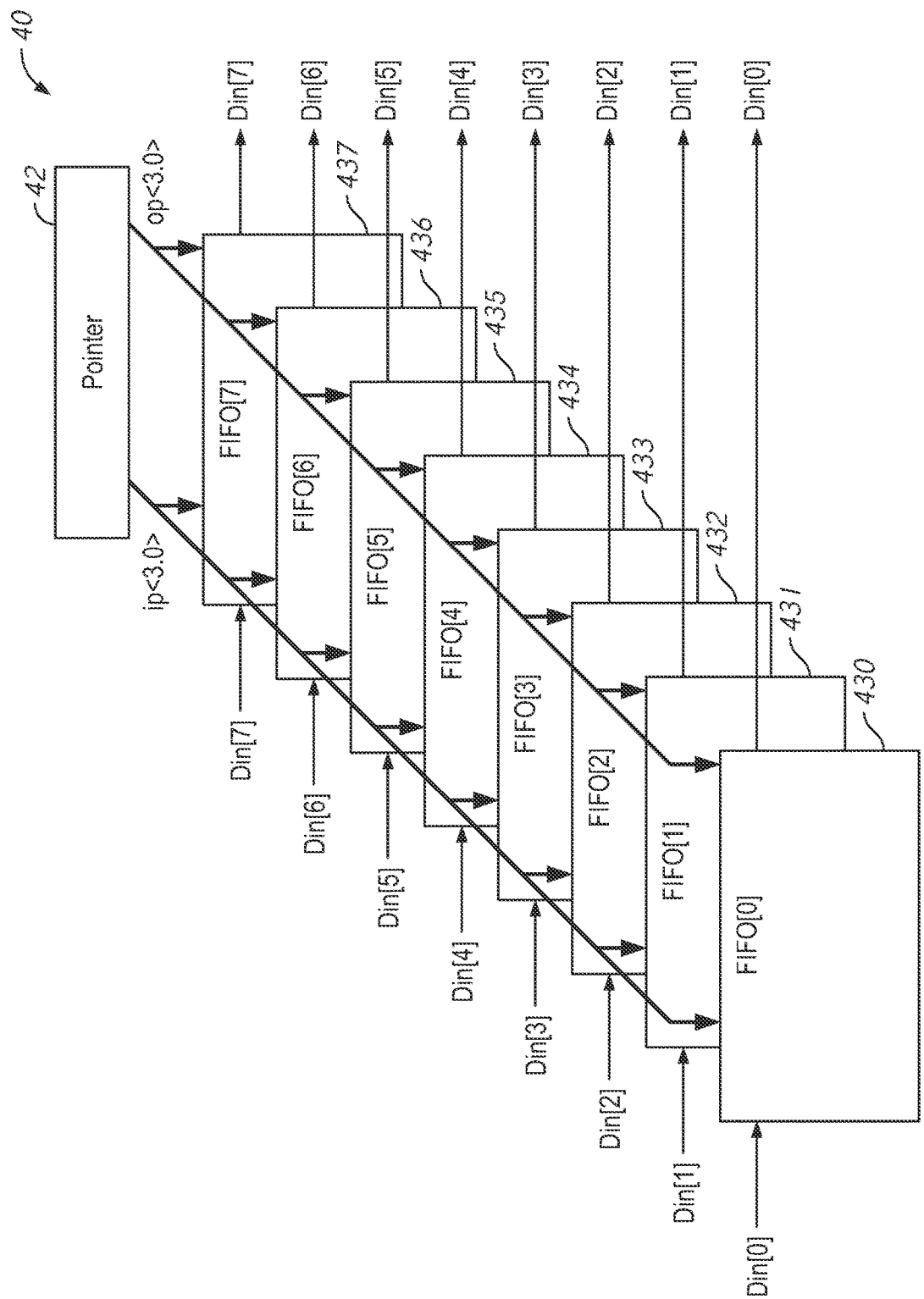
FIG. 4 is a schematic diagram of a plurality of FIFO circuits and a pointer circuit in accordance with an embodiment of the present disclosure.

FIG. 4 is a schematic diagram of a data circuit 40 in accordance with an embodiment of the present disclosure. The data circuit 40 may include a plurality of FIFO circuits 430 to 437 and a pointer circuit 42. Each FIFO circuit of the plurality of FIFO circuits 430 to 437 may be the FIFO circuit 30 of FIG. 3A. The pointer circuit 42 may be the pointer circuit 220 of FIG. 2C that provides input pointer signals ip<3:0> having different phases and output pointer signals op<3:0> having different phases generated from the identical clock signal CLK, for example. Alternatively, the pointer circuit 42 may generate the input pointer signals ip<3:0> and the output pointer signals op<3:0> by using two separate clock signals. The data circuit 40 may receive one-byte (eight-bits) data Din[0] to Din[7] at the plurality of FIFO circuits 430 to 437, respectively. The pointer circuit 42 may provide input pointer signals ip<3:0> and output pointer signals op<3:0>. The plurality of FIFO circuits 430 to 437 may receive the input pointer signals ip<3:0> and the output pointer signals op<3:0>. Thus, for each data bit of data bits Din[0] to Din[7], the plurality of FIFO circuits 430 to 437 may receive the data bits Din[0] to Din[7] responsive to the input pointers signals ip<3:0> and provide the data bits Din[0] to Din[7] responsive to the output pointer signals op<3:0> as shown in FIGS. 3A and 3B. Thus, the plurality of FIFO circuits 430 to 437 may store data bits Din[0] to Din[7] for a period of six clock cycles of the clock signal CLK using the same pointer signals ip0 to ip3 and op0 to op3 used for the FIFO circuit 20, such as the input pointer signals ip<3:0> and the output pointer signals op<3:0>1 to op3 that can be provided by the pointer circuit 220 of FIG. 2C, without enhancement of the pointer circuit 220. In FIG. 4, the number of the plurality of FIFO circuits 430-437 in the data circuits 40 are eight; however, the number of the plurality of FIFO circuits in the data circuits 40 may not be limited to eight. The number of the plurality of FIFO circuits in the data circuits 40 may correspond to a number of bits (e.g., data width) to be transmitted in one clock cycle.

Figure 5:
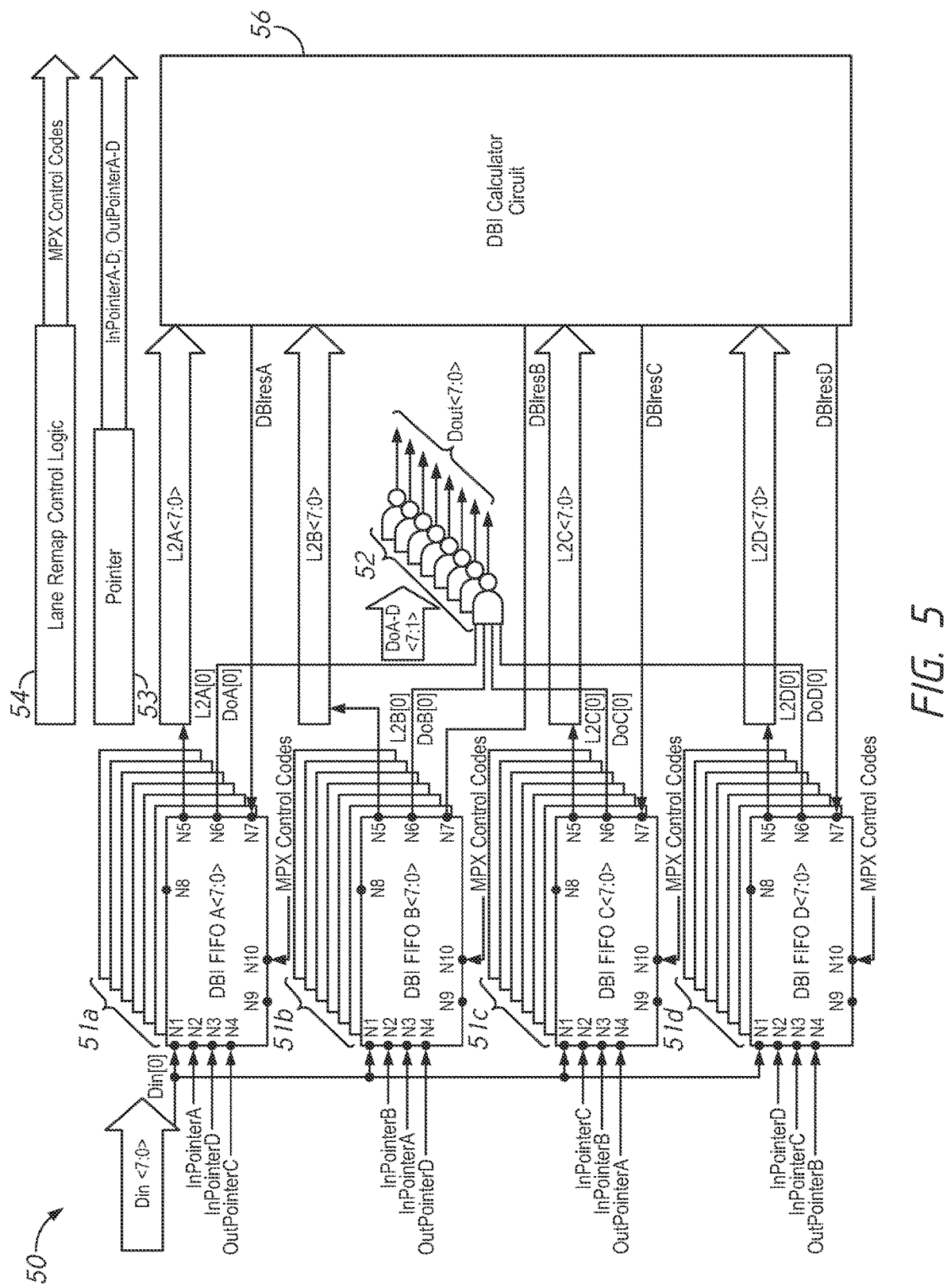
FIG. 5 is a schematic diagram of a DBI circuit in accordance with an embodiment of the present disclosure.

FIG. 5 is a schematic diagram of a DBI circuit 50 in accordance with an embodiment of the present disclosure. The DBI circuit 50 may include a plurality of DBI FIFO A circuits <7:0> 51a, a plurality of DBI FIFO B circuits <7:0> 51b, a plurality of DBI FIFO C circuits <7:0> 51c and a plurality of DBI FIFO D circuits <7:0> 51d provided for input data Din <7:0>. The DBI circuit 50 may also include a DBI calculator circuit 56, a pointer circuit 53 that may receive a clock signal CLK and an output circuit 52 that may provide output data Dout <7:0>. The DBI circuit 50 may further include a lane remap control logic 54 that may provide a multiplexer (MPX) control codes to the plurality of DBI FIFO A circuits <7:0> 51a, the plurality of DBI FIFO B circuits <7:0> 51b, the plurality of DBI FIFO C circuits <7:0> 51c and the plurality of DBI FIFO D circuits <7:0> 51d. The plurality of DBI FIFO A circuits <7:0> 51a, the plurality of DBI FIFO B circuits <7:0> 51b, the plurality of DBI FIFO C circuits <7:0> 51c and the plurality of DBI FIFO B circuits <7:0> 51d in FIG. 5 may receive common input data Din <7:0>. The pointer circuit 53 may provide InPointerA, InPointerB, InPointerC and InPointerD signals responsive to the clock signal CLK (e.g., as shown in FIG. 2C). The pointer circuit 53 may further provide OutPointerA, OutPointerB, OutPointerC and OutPointerD signals responsive to the clock signal CLK. Each of the plurality of DBI FIFO A circuits <7:0> 51a, the plurality of DBI FIFO B circuits <7:0> 51b, the plurality of DBI FIFO C circuits <7:0> 51c and the plurality of DBI FIFO D circuits <7:0> 51d may receive a combination of those pointer signals. In the example of FIG. 5, the plurality of DBI FIFO A circuits <7:0> 51a may receive the pointer signals InPointerA, InPointerD and OutPointerC, the plurality of DBI FIFO B circuits <7:0> 51b may receive the pointer signals InPointerB, InPointerA and OutPointerD, the plurality of DBI FIFO C circuits <7:0> 51c may receive the pointer signals InPointerC, InPointerB and OutPointerA, and the plurality of DBI FIFO D circuits <7:0> 51d may receive the pointer signals InPointerD, InPointerC and OutPointerB, respectively. However, other configurations (e.g., a combination of InPointer/OutPointer signals for each plurality of DBI FIFO circuits) may be possible and the configuration is not limited to the configuration of FIG. 5. The DBI calculator circuit 56 may perform DBI calculation to detect whether the majority bits of the current data are different in logic level from the previous data.

Figure 6:
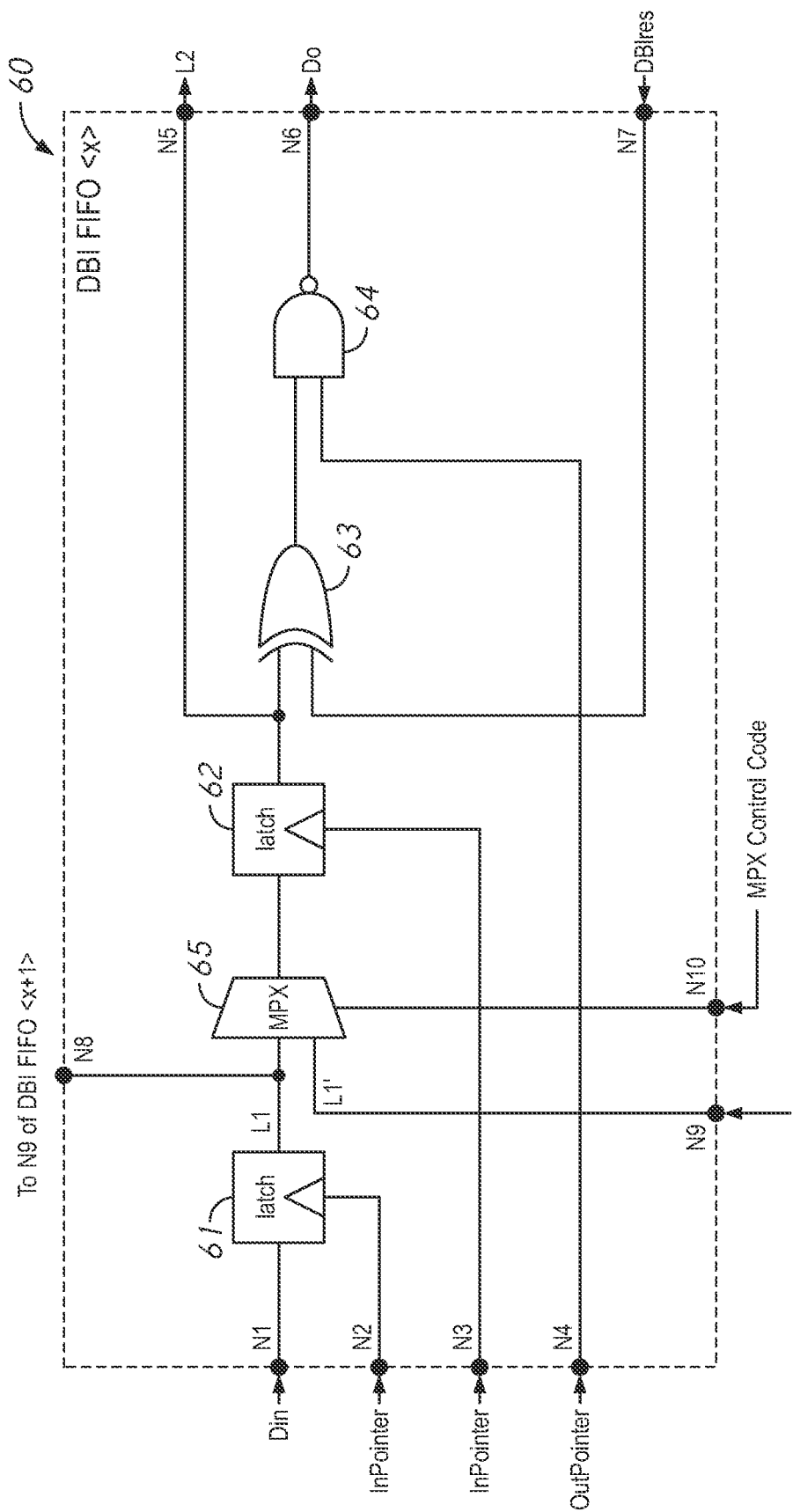
FIG. 6 is a circuit diagram of a DBI First-In First-Out (FIFO) circuit in accordance with an embodiment of the present disclosure.

FIG. 6 is a circuit diagram of a DBI FIFO circuit [x] 60 in accordance with an embodiment of the present disclosure. For example, the DBI FIFO circuit [x] 60 may be each DBI FIFO circuit of the plurality of DBI FIFO A, B, C and D circuits <7:0> 51a, 51b, 51c and 51d in FIG. 5, where x may be an integer between 0 and 7. The DBI FIFO circuit [x] 60 may include two latch circuits 61 and 62, a bit inverter 63 (e.g., XOR circuit) and a NAND circuit 64. The DBI FIFO circuit 60 may further include a multiplexer MPX 65. For example, the latch circuit 61 may latch (e.g., temporarily store) a corresponding bit Din[x] of the data Din <7:0> on a node N1 in response to InPointer signal on a node N2, and may further provide a signal L1 to the multiplexer MPX 65 and to a node N8. The multiplexer MPX 65 may receive the signal L1 and another signal L1' on a node N9 from a latch circuit 61 (not shown) of another DBI FIFO circuit [x−1] 60 that may receive a corresponding bit Din[x−1], if x is equal to 1 or larger. The multiplexer MPX 65 may further receive the MPX control code from a node N10 and may further provide either the L1 signal representing the Din[x] bit or the L1' signal representing the Din[x−1] bit to the latch circuit 62 responsive to the MPX control code. The latch circuit 62 may latch (e.g., temporarily store) an output signal L1 from the multiplexer MPX 65 responsive to another InPointer signal on a node N3. The latch circuit 62 may provide a signal L2 on a node N5 and further to the bit inverter 63 that may receive DBIres signal at a node N7. In this example, the bit inverter 63 may be constituted by an exclusive OR (XOR) gate. The bit inverter 63 may provide an output signal to an NAND circuit 64 that may also receive OutPointer signal on a node N4. The NAND circuit 64 may provide a corresponding bit of output data Do to a node N6.

Figure 7:
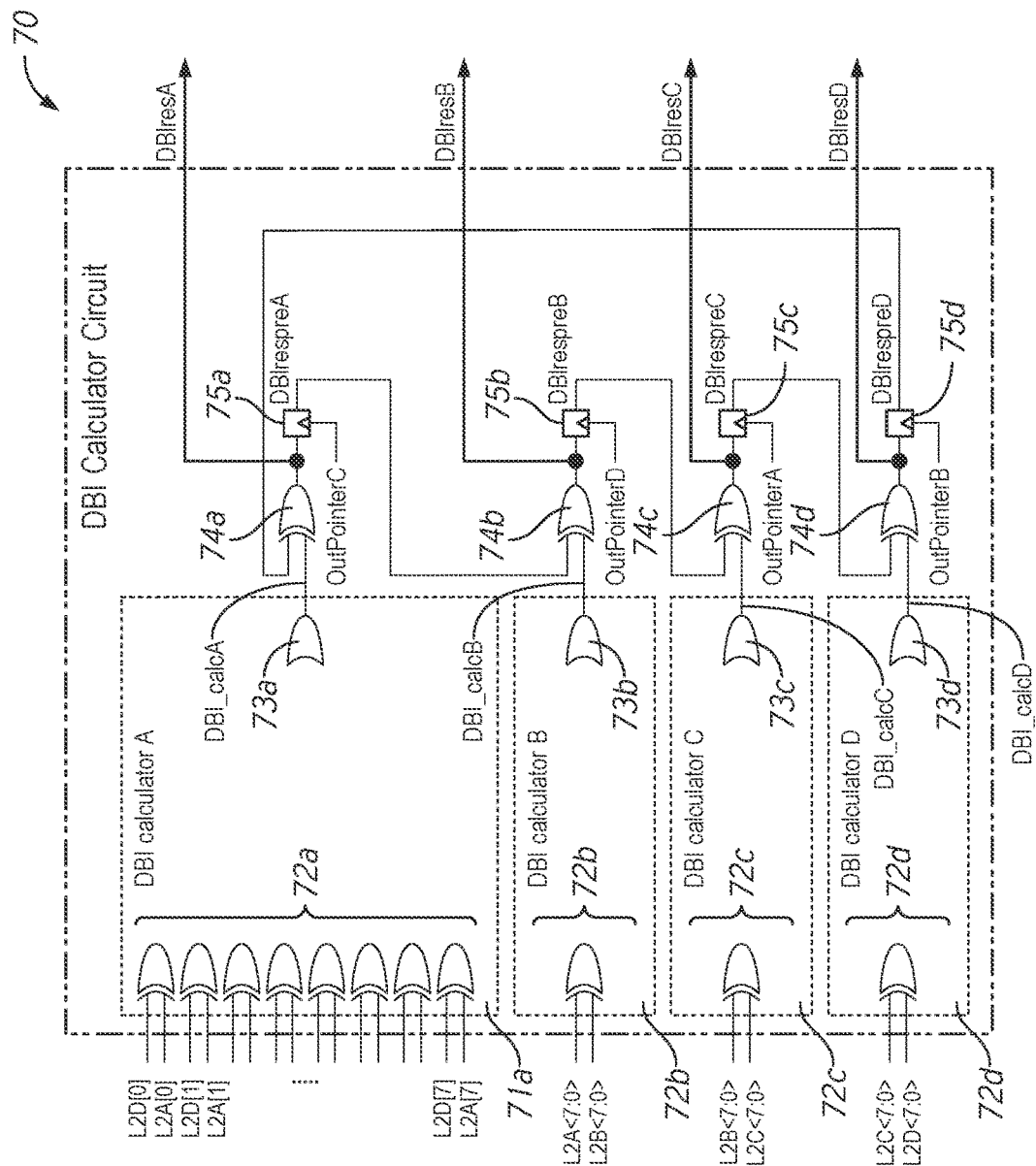
FIG. 7 is a circuit diagram of a DBI calculator circuit in accordance with an embodiment of the present disclosure.

FIG. 7 is a circuit diagram of a DBI calculator circuit 70 in accordance with an embodiment of the present disclosure. For example, the DBI calculator circuit 70 may be the DBI calculator circuit 56 in FIG. 5. For example, the DBI calculator circuit 70 may include a DBI calculator A 71a, a DBI calculator B 71b, a DBI calculator C 71c and a DBI calculator D 71d. For example, a DBI calculation cycle (tDBI) in the DBI calculators A, B, C and D 71a, 71b, 71c and 71d may be longer than two clock cycles (2tCK) (e.g., between two and three clock cycles) of the clock signal CLK. Description of components corresponding to components included in the DBI calculator A 71a, the DBI calculator B 71b, the DBI calculator C 71c and the DBI calculator D 71d will be provided in detail referring to a DBI calculator 80 in FIG. 8.

The DBI calculator A 71a may receive signals L2A<7:0> (e.g., L2 signals of the DBI FIFO A circuits <7:0> 51a) from the DBI FIFO A circuits <7:0> 51a. The DBI calculator A 71a may also receive data signals L2D<7:0> from the DBI FIFO D circuits <7:0> 91d. The DBI calculator A 71a may include a plurality of comparator circuits 72a. For example, the plurality of comparator circuits 72a may be XOR circuits. Each comparator circuit of the plurality of comparator circuits 72a may receive a corresponding bit of the signals L2A<7:0> and a corresponding bit of the signals L2D<7:0> and provide a result signal for each corresponding bit. For example, the result signal may be an active state (e.g., "1" or a logic high level), if the corresponding bit of the signals L2A<7:0> and the corresponding bit of the signals L2D<7:0> are different, which indicates that the corresponding bits of the previous data and the current data are different. Similarly, the result signal may be an inactive state (e.g., "0" or a logic low level), if the corresponding bit of the signals L2A<7:0> and the corresponding bit of the signals L2D<7:0> are the same, which indicates that the corresponding bits of the previous data and the current data are the same. The DBI calculator A 71a may include an adder circuit 73a. For example, the adder circuit 73 may be an OR circuit. The adder circuit 73a may receive calculation signals after calculations based on the result signals from the plurality of comparator circuits 73a and may provide a DBI calculation signal DBI_calcA. Calculations based on the result signals will be described in detail with reference to FIG. 8. The comparator circuit 74a may receive the DBI calculation signal DBI_calcA and a previous DBI calculation result signal DBIrespreD from a flip-flop circuit 75d based on DBI calculation by the DBI calculator D 71d. If the DBI calculation signal DBI_calcA and the previous DBI calculation result signal DBIrespreD are different, the comparator circuit 74a may provide the current DBI calculation result signal DBIresA in an active state (e.g., "1" or a logic high level). If the DBI calculation signal DBI_calcA and the previous DBI calculation result signal DBIrespreD are the same, the comparator circuit 74a may provide the current DBI calculation result signal DBIresA in an inactive state (e.g., "0" or a logic low level). A flip-flop circuit 75a may receive the current DBI calculation result signal DBIresA and latch the current DBI calculation result signal DBIresA with the pointer signal OutPointerC and may provide the latched current DBI calculation result signal DBIresA as a previous DBI calculation result signal DBIrespreA responsive to the pointer signal OutPointerC. In a similar manner, the DBI calculator B 71b may include a plurality of comparator circuits 72b and an adder circuit 73b and provide a DBI calculation signal DBI_calcB, the DBI calculator C 71c may include a plurality of comparator circuits 72c and an adder circuit 73c and provide a DBI calculation signal DBI_calcC, and the DBI calculator D 71d may include a plurality of comparator circuits 72d and an adder circuit 73d and provide a DBI calculation signal DBI_calcD. The DBI calculator circuit 70 may further include comparators 74b, 74c, and 74d and flip-flop circuits 75b, 75c and 75d. The comparator 74b may receive the DBI calculation signal DBI_calcB and the previous DBI calculation result signal DBIrespreA and provide a current DBI calculation result signal DBIresB. The flip-flop circuit 75b that may receive the current DBI calculation result signal DBIresB and the pointer signal OutPointerD and provide a previous DBI calculation result signal DBIrespreB. The comparator 74c may receive the DBI calculation signal DBI_calcC and the previous DBI calculation result signal DBIrespreB and provide a current DBI calculation result signal DBIresC. The flip-flop circuit 75c that may receive the current DBI calculation result signal DBIresC and the pointer signal OutPointerA and provide a previous DBI calculation result signal DBIrespreC. The comparator 74d may receive the DBI calculation signal DBI_calcD and the previous DBI calculation result signal DBIrespreC and provide a current DBI calculation result signal DBIresD. The flip-flop circuit 75d that may receive the current DBI calculation result signal DBIresD and the pointer signal OutPointerB and provide a previous DBI calculation result signal DBIrespreD.

Figure 8:
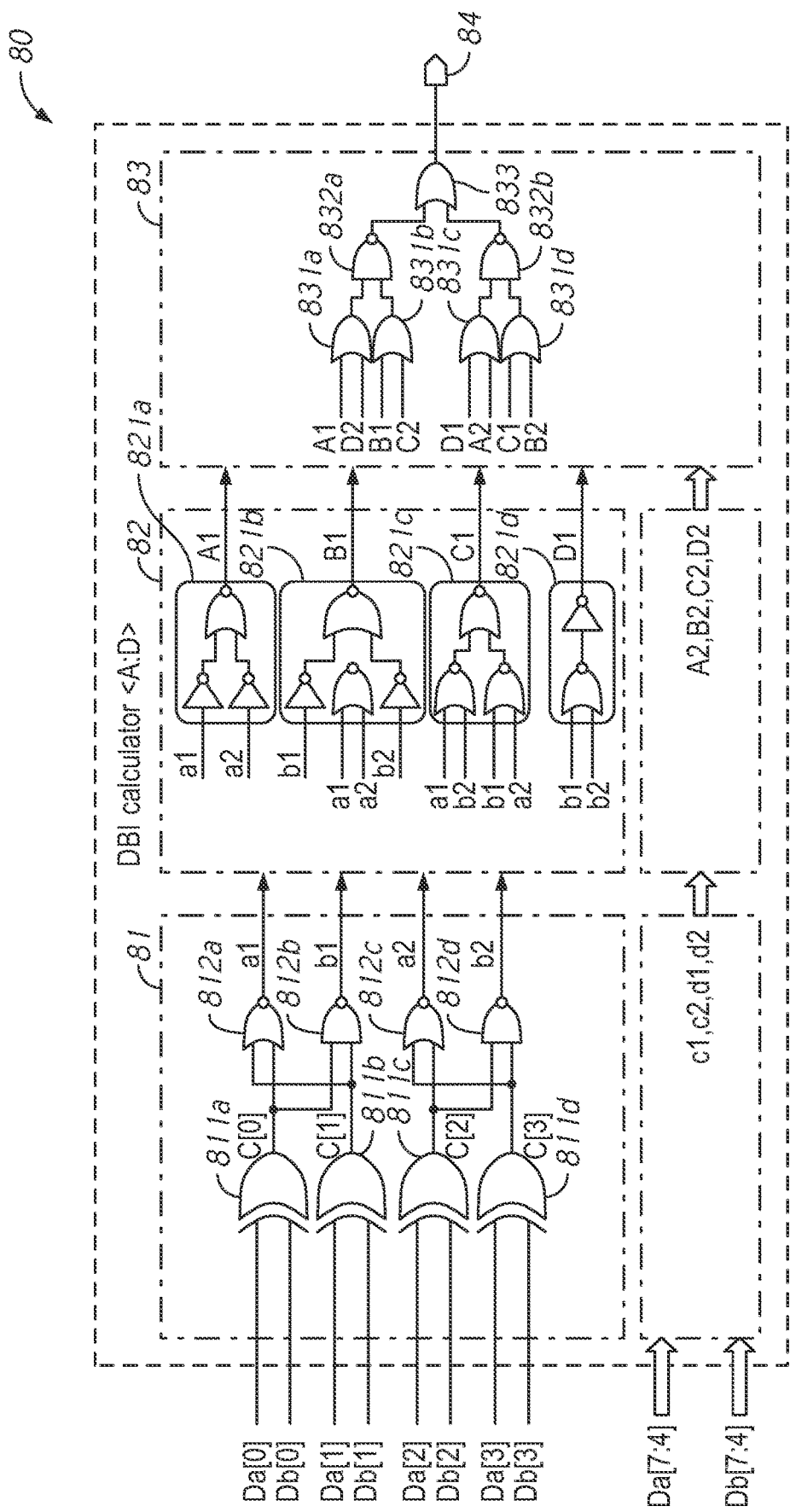
FIG. 8 is a DBI calculator circuit in accordance with an embodiment of the present disclosure.

FIG. 8 is a DBI calculator circuit 80 in accordance with an embodiment of the present disclosure. For example, the DBI calculator circuit 80 may be used as the DBI calculator circuits 71a to 71d in FIG. 7. The DBI calculator circuit 80 may perform DBI calculation to detect whether the majority bits of the current data are different in logic level from the previous data. The DBI calculator circuit 80 may include an input stage 81, an intermediate stage 82 and an output stage 83. The input stage 81 of the DBI calculator circuit 80 may include a plurality of comparator circuits 811a to 811d for corresponding bits (e.g., Da[3:0]) of current data and corresponding bits (e.g., Db[3:0]) of the previous data. For example, the plurality of comparator circuits 811a to 811d may be logic XOR circuits. For example, a comparator circuit 811a may receive Da[0] bit of the current data and Db[0] bit of the previous data and provide a change bit C[0] indicative of whether a corresponding bit D[0] is changed from the previous data to the current data. The change bit C[0] is in an active state (e.g., a logic high level) if the corresponding bit D[0] is changed, because Da[0] bit of the current data and Db[0] bit of the previous data are different. Similarly, comparator circuits 811b to 811d may compare Da[1:3] bits and Db[1:3] bits and provide C[1:3] representing whether corresponding bits D[1:3] are changed. The input stage 81 of the DBI calculator circuit 80 may also include logic circuits 812a to 812d. For example, the logic circuit 812a may be a logic NOR circuit which may receive C[0] and C[1] and may provide an intermediate signal a1 that is a NOR operation of C[0] and C[1] indicating whether any of the bits D[0:1] is changed. For example, the intermediate signal a1 represents "1 (=at logic high level)" if none of the bits D[0:1] is changed. The logic circuit 812b may be a logic NAND circuit which may receive C[0] and C[1] and may provide an intermediate signal b1 that is a NAND operation of C[0] and C[1] indicating whether all the bits D[0:1] is changed. For example, the intermediate signal b1 represents "1" if any of the bits D[0:1] is unchanged. Similarly, the logic circuit 812c and the logic circuit 812d may be a logic NOR circuit and a logic NAND circuit which may receive C[2] and C[3] and may provide intermediate signals a2 and b2 that are a NOR operation and a NAND operation of C[2] and C[3].

The intermediate stage 82 of the DBI calculator circuit 80 may include a plurality of logic circuits 821a to 821d. The logic circuit 821a may receive the intermediate signals a1 and a2, invert the intermediate signals a1 and a2, and execute an NOR operation to the inverted intermediate signals a1' and a2' to provide another intermediate signal A1 that is indicative whether none of the bits D[0:3] is changed (e.g., A1 represents "1" if none of the bits D[0:3] is changed). The logic circuit 821b may receive the intermediate signals a1, a2, b1 and b2, invert the intermediate signals b1 and b2, execute an NOR operation to the intermediate signals a1 and a2, and may further execute an NOR operation of the inverted intermediate signals of b1 and b2 and the NOR value of the intermediate signals a1 and a2 to provide another intermediate signal B1 that is indicative whether a number of bits changed in the bits D[0:3] is limited to 1 (e.g., B1 represents "1" if the number of changed bits is 0 or 1). The logic circuit 821c may receive the intermediate signals a1, a2, b1 and b2, execute an NOR operation to the intermediate signals a1 and b2, execute another NOR operation to the intermediate signals a2 and b1, and further execute an NOR operation to the NOR value the intermediate signals a1 and b2 and the NOR value of the intermediate signals a2 and b1 and provide another intermediate signal C1 that is indicative whether the number of bits changed in the bits D[0:3] is limited to 2 (e.g., C1 represents "1" if the number of changed bits is either 0, 1 or 2). The logic circuit 821d may receive the intermediate signals b1 and b2, execute an NOR operation to the intermediate signals b1 and b2, and further invert the NOR value and provide the inverted NOR value as another intermediate signal D1 that is indicative whether the number of bits changed in the bits D[0:3] is limited to three (e.g., C1 represents "0" if the number of changed bits is four). Thus, the intermediate signals A1, B1, C1 and D1 may represent whether the number of bits changed in the bits D[0:3] is limited to 0, 1, 2 and 3, respectively. Similarly, from Da[7:4] and Db[7:4], the input stage 81 may provide the intermediate signals c1, c2, d1 and d2 and the intermediate stage 82 may provide intermediate signals A2, B2, C2 and D2 that may represent whether the number of bits changed in the bits D[4:7] is limited to 0, 1, 2 and 3, respectively.

The output stage 83 may be an evaluation circuit 83. For example, the evaluation circuit 83 may include a plurality of logic circuits 831a to 831d, another plurality of logic circuits 832a and 832b, and an output logic circuit 833 (e.g., OR gate). For example, the plurality of logic circuits 831a to 831d may be logic OR circuits, the plurality of logic circuits 832a and 832b may be logic NAND circuits, and the output logic circuit may be a logic OR circuit. The logic circuit 831a may receive the intermediate signals A1 and D2 and provide an OR value of the intermediate signals A1 and D2 to the logic circuit 832a. The logic circuit 831b may receive the intermediate signals B1 and C2 and provide an OR value of the intermediate signals B1 and C2 to the logic circuit 832a. Similarly, the logic circuit 831c may provide an OR value of the intermediate signals D1 and A2 to the logic circuit 832b, and the logic circuit 831d may provide an OR value of the intermediate signals C1 and B2 to the logic circuit 832b. The logic circuits 832a and 832b may execute NAND operations and provide results to the output logic circuit 833. The output logic circuit 833 may receive output signals from the logic circuits 832a and 832b and provide a DBI calculation result signal DBI_calc. For example, the DBI calculation result signal DBI_calc may be in an active state (e.g., a logic high level) if the majority of the bits (e.g., five or more bits) of the current data are different in logic level from the previous data, and the DBI calculation result signal DBI_calc may be in an inactive state (e.g., a logic low level) if the majority of the bits of the current data are not different in logic level from the previous data (e.g., four bits or fewer changed). For example, each comparator of the plurality of comparators 811 in the input stage 81 of the DBI calculator circuit 80 of FIG. 8 may correspond to each comparator of the plurality of comparator circuits 72a (or 72b, 72c, 72d) of the DBI calculator A 71a (or the DBI calculators B, C, D 71b, 71c, 71d) of FIG. 7. For example, the output logic circuit 833 of the output stage 83 of the DBI calculator circuit 80 of FIG. 8 may correspond to the adder circuit 73a (or the adder circuits 73b, 73c, 73d) of the DBI calculator A 71a (or the DBI calculators B, C, D 71b, 71c, 71d).

Figure 9:
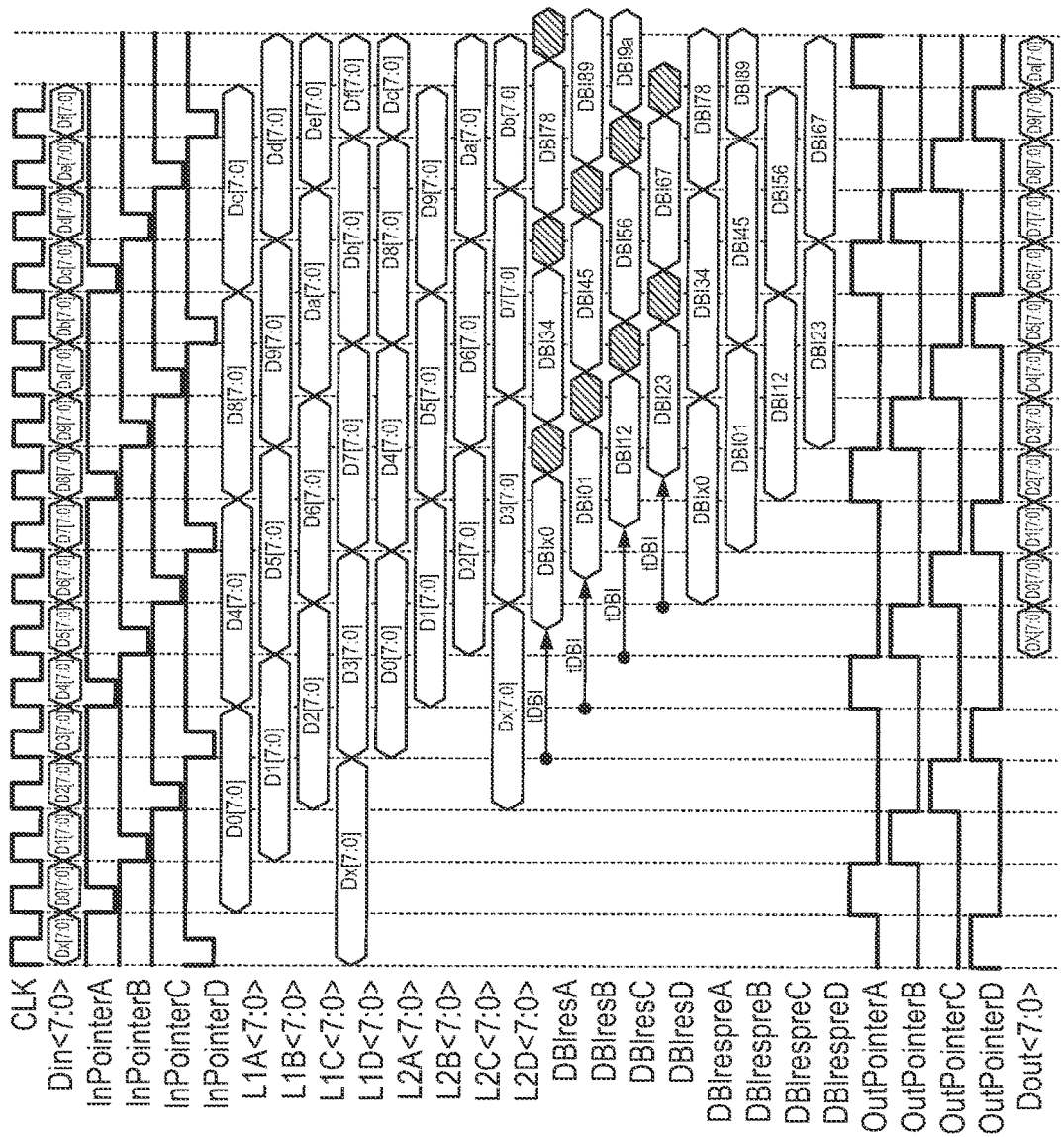
FIG. 9 is a timing diagram of signals in the DBI circuit during a DBI operation in accordance with an embodiment of the present disclosure.

FIG. 9 is a timing diagram of signals in the DBI circuit 50 during a DBI operation in accordance with an embodiment of the present disclosure. With the above configurations, the DBI circuit 50 may perform a DBI operation on the current input data and the previous input data. The plurality of DBI FIFO A circuits <7:0> 51a, the plurality of DBI FIFO B circuits <7:0> 51b, the plurality of DBI FIFO C circuits <7:0> 51c and the plurality of DBI FIFO D circuits <7:0> 51d may internally latch common input data D0-D7[7:0] of the input data Din <7:0> (e.g., at the latch circuits 61) responsive to InPointerA, InPointerB, InPointerC and InPointerD signals from the pointer circuit 53 and may provide a string of data D0[7:0], D1[7:0], D2[7:0], D3[7:0] as L1A-L1D signals, respectively. After selectively multiplexing with the L1A-L1D signals from neighbor DBI FIFO circuits at multiplexers in each DBI FIFO circuit (e.g., the multiplexer MPX 65 in FIG. 6), the plurality of DBI FIFO A circuits <7:0> 51a, the plurality of DBI FIFO B circuits <7:0>51b, the plurality of DBI FIFO C circuits <7:0> 51c and the plurality of DBI FIFO D circuits <7:0>51d may internally latch the L1A-L1D signals (e.g., the L1A-L1D signals from the multiplexers MPX 65 at the latch circuits 62) responsive to InPointerD, InPointerA, InPointerB and InPointerC signals from the pointer circuit 53, and may provide the string of data D0[7:0], D1[7:0], D2[7:0], D3[7:0] as L2A-L2D signals, respectively, with a delay of three clock cycles. Furthermore, the plurality of DBI FIFO A circuits <7:0> 51a, the plurality of DBI FIFO B circuits <7:0> 51b, the plurality of DBI FIFO C circuits <7:0> 51c and the plurality of DBI FIFO D circuits <7:0> 51d may internally provide the L2A-L2D signals responsive to the DBI calculation result signals DBIres (e.g., at the bit inverters 63) with a delay of the DBI calculation cycle (tDBI). Finally, the plurality of DBI FIFO A circuits <7:0> 51a, the plurality of DBI FIFO B circuits <7:0> 51b, the plurality of DBI FIFO C circuits <7:0> 51c and the plurality of DBI FIFO D circuits <7:0> 51d may provide output data signals Dout[7:0] responsive to the OutPointerA, OutPointerB, OutPointerC and OutPointerD signals (e.g., at the NAND circuit 64).

As mentioned earlier referring to FIGS. 5, 6 and 9, the lane remap control logic 54 may provide the MPX control codes to the multiplexers (e.g., a lane remapping circuit) in the plurality of DBI FIFO A circuits <7:0> 51a, the plurality of DBI FIFO B circuits <7:0> 51b, the plurality of DBI FIFO C circuits <7:0> 51c and the plurality of DBI FIFO D circuits <7:0> 51d. The lane remap control logic 54 may provide MPX control codes that cause multiplexers in the lane remapping circuit of the DBI FIFO circuits 51a-51d to switch between input signals and each multiplexer may provide one of the input signals as an output signal by data bus coupling.

Figure 10:
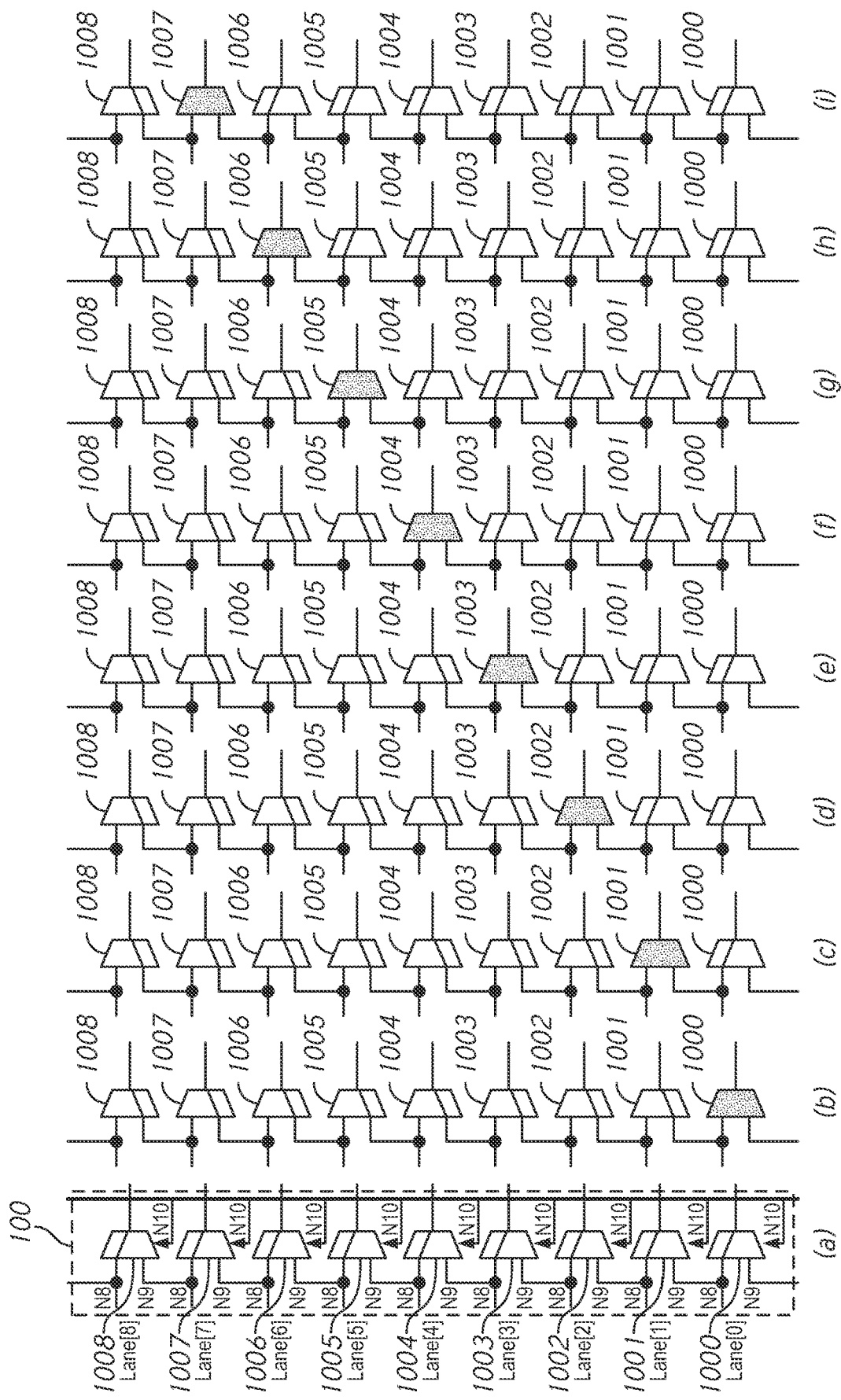
FIG. 10 is a schematic diagram of a lane remapping circuit in accordance with an embodiment of the present disclosure.

FIG. 10 is a schematic diagram of a lane remapping circuit 100 in accordance with an embodiment of the present disclosure. The lane remapping circuit 100 may be included in each plurality of DBI FIFO circuits <7:0>, such as the plurality of DBI FIFO A circuits <7:0> 51a, the plurality of DBI FIFO B circuits <7:0> 51b, the plurality of DBI FIFO C circuits <7:0> 51c and the plurality of DBI FIFO D circuits <7:0> 51d. The lane remapping circuit 100 may include a plurality of multiplexers 1000 to 1008 that correspond to a plurality of lanes <0:8>. For example, the plurality of lanes <0:8> may include a plurality of through electrodes. Each multiplexer of the plurality of multiplexers 1000 to 1008 may be included in each DBI FIFO circuit of a plurality of DBI FIFO circuits (e.g., the plurality of DBI FIFO A circuits <7:0> 51a, the plurality of DBI FIFO B circuits <7:0> 51b, the plurality of DBI FIFO C circuits <7:0> 51c or the plurality of DBI FIFO D circuits <7:0> 51d). Each multiplexer of the multiplexers 1000 to 1008 on Lane [0] to Lane [8] may respectively receive input signals L1 and L1' from the nodes N8 and N9 as shown in FIG. 6. For example, the multiplexers 1000 to 1007 in the plurality of DBI FIFO A circuits <7:0> may receive input data Din[0:7] respectively as input signals L1 from the nodes N8 and the multiplexers 1001 to 1008 in the plurality of DBI FIFO A circuits <7:0> may receive input data Din[0:7] respectively as input signals L1' from the nodes N9. Thus, the input signal L1 of the multiplexer 1000 of Lane [0] may be a corresponding bit of input data Din[0], the input signals L1 and L1' of the multiplexer 1001 of Lane [1] may be corresponding bits of the input data Din [1] and Din[0], which is the input signal L1 of the multiplexer 1000 of Lane [0] that is a neighbor lane of Lane [1], respectively. Similarly, the input signals L1 and L1' of the multiplexer 1007 of Lane [7] may be corresponding bits of the input data Din[7] and Din[6], which is the input signal L1 of the multiplexer 1006 of Lane [6] that is a neighbor lane of Lane [7]. Lane [8] may be dedicated to a DBI bit indicating whether the DBI is executed on the current input data when there is no defective path among Lane [0] to Lane [7], whereas Lane [8] may provide a redundancy lane when there is a defective path on any lane among Lane [0] to Lane [7]. An example of lane coupling arrangement including Lane [8] is shown in detail with referring to FIGS. 11A and 11B. The input signal L1' of the multiplexer 1008 of Lane [8] may be a corresponding bit of the input data Din[7] that is the input signal L1 of the multiplexer 1007 of Lane [7]. The multiplexer 1008 of Lane [8] may receive the DBI bit as the input signal L1 from the node N8 to Lane [8], not any bit of the input data Din<7:0>. The multiplexer 1008 thus may provide the DBI bit, the input signal L1 as an output signal when there is no defective path in Lanes [0] to [7] and encoding and decoding on the output data may be executed in a later stage. The multiplexers 1000 to 1008 may receive the MPX control codes from nodes N10. For example, the MPX control codes may be provided by the lane remap control logic 54 in FIG.

5. Each multiplexer of the multiplexer 1000 to 1008 may select either the input signal L1 or the input signal L1' responsive to the MPX control code and provide the selected input signal.

In pattern (a) of FIG. 10, there is no defective lane, and the multiplexer 1000 to 1008 may select the input signals L1 from N8 and provide the input signals L1. In pattern (b) of FIG. 10, Lane [0] is a defective lane and the multiplexer 1000 may not be able transmit any selected signal because of the defect ahead in Lane [0]. The multiplexers 1001 to 1008 may selective input signals L1' from N9 nodes and provide the input signals L1' to provide the input data, namely, Din[0] to Din[7]. In pattern (c) of FIG. 10, Lane [1] is a defective lane and the multiplexer 1001 may not transmit any selected signal because of the defect ahead in Lane [1]. The multiplexer 1000 may provide the input signal L1 from N8 node to provide Din[0] on Lane [0], whereas the multiplexers 1002 to 1008 may select the input signals L1' from N9 nodes to transmit the input data Din<1:7> to Lane [2] to Lane [8] respectively and provide the input signals L1'. Similarly, in pattern (d) to pattern (i) when Lane [x] is a defective lane (where x is an integer and 0≤x≤7), the multiplexers 1000 to (1000+x−1) may select the input signals L1 from N8 nodes to transmit corresponding bits of the input data Din<0:(x−1)> on input terminals of Lane [0] to Lane [x−1] and provide the input signals, whereas the multiplexers (1000+x+1) to 1008 may select provide the input signals L1' from N9 nodes (e.g., next bits to the corresponding bits) and provide the input signals L1', in order to transmit corresponding bits of the input data Din<x:7> at input terminals of Lane [x] to Lane [7] to next lanes, such as Lane [x+l] to lane[8], respectively.

Figures 11A, 11B:
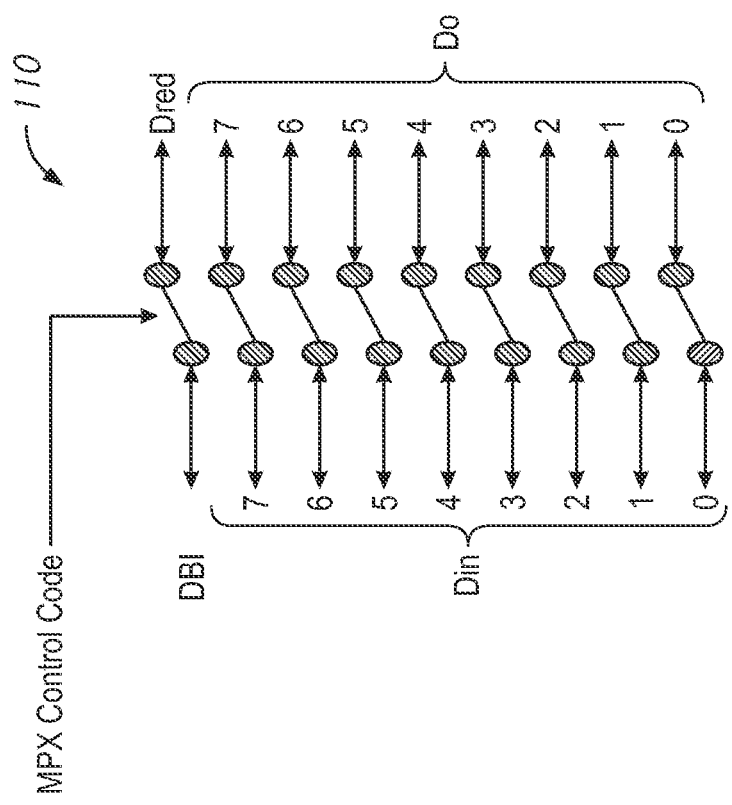
FIG. 11A is a schematic diagram of data bus coupling in a lane remapping circuit in a DBI circuit in accordance with an embodiment of the present disclosure.
FIG. 11B is a truth table of data bus coupling in the lane remapping circuit in accordance with an embodiment of the present disclosure.

FIG. 11A is a schematic diagram of data bus coupling in a lane remapping circuit 110 in accordance with an embodiment of the present disclosure. FIG. 11B is a truth table of data bus coupling in the lane remapping circuit 110 in accordance with an embodiment of the present disclosure. The lane remapping circuit 110 shown FIG. 11A may be used as the lane remapping circuit 100 of FIG. 10. For example, the lane remapping circuit 110 may include input data L1 nodes providing Din <0:(x−1)> (x: a number of bits of data) coupled to data nodes N1 in a DBI FIFO circuit and output data nodes Do <0:(x−1)> coupled to data nodes N6 and/or a data redundancy port Dred. The lane remapping circuit 110 may further include a DBIchip port that may be coupled to the data redundancy port Dred. When a via coupled to an output data node Do[k] (k: a positive integer smaller than (x−1)) is defective and the MPX control code is greater than "0", a defective via may be decoupled (kept in a high-impedance state HiZ) from data transmission paths while the bit data to be transmitted on the defective via may be detoured. DBI encoding and decoding may be executed in a stage prior to the plurality of DBI FIFO circuits, responsive to the MPX control code being greater than "0". When the MPX control code is equal to "0" indicating that there is no redundancy bit usage due to a defective via, then all the L1 data nodes providing Din <0:(x−1)> may be coupled to all the output data nodes Do<0:(x−1)> and the DBI bit may be transmitted to the data redundancy port Dred and DBI encoding and decoding may be executed in a stage later than the plurality of DBI FIFO circuits.

Logic levels of signals used in the embodiments described the above are merely examples. However, in other embodiments, combinations of the logic levels of signals other than those specifically described in the present disclosure may be used without departing from the scope of the present disclosure.

Although embodiments of the disclosure have been described, it will be understood by those skilled in the art that the disclosure extends beyond the specifically disclosed embodiments to other alternative embodiments and/or uses and obvious modifications and equivalents thereof. In addition, other modifications which are within the scope of the disclosure will be readily apparent to those of skill in the art. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying modes of other embodiments of the disclosure. Thus, it is intended that the scope of the disclosure should not be limited by the particular disclosed embodiments described above.

What is claimed is:

1. An apparatus comprising:
   an input terminal supplied with an input signal;
   first and second latches coupled in series between the input terminal and a first node, the first latch configured to be controlled by a first input pointer signal, and the second latch configured to be controlled by a second input pointer signal;
   third and fourth latches coupled in series between the input terminal and a second node, the third latch configured to be controlled by a third input pointer signal, the fourth latch configured to be controlled by a fourth input pointer signal, a phase of the third input pointer signal being different from a phase of the first input pointer signal, and a phase of the fourth input pointer signal being different from a phase of the second input pointer signal;
   a first circuit coupled to the first node and configured to be controlled by a first output pointer signal; and
   a second circuit coupled to the second node and configured to be controlled by a second output pointer signal, a phase of the second output pointer signal being different from a phase of the first output pointer signal.

2. The apparatus of claim 1,
   wherein the phases of the first and third input pointer signals are controlled such that the first latch is configured to latch the input signal and thereafter the third latch is configured to latch the input signal; and
   wherein the phases of the second and fourth input pointer signals are controlled such that the second latch is configured to latch an output signal of the first latch and thereafter the fourth latch is configured to latch an output signal of the second latch.

3. The apparatus of claim 2,
   wherein the phases of the first and second output pointer signals are controlled such that the first circuit is configured to provide an output signal of the second latch and thereafter the second circuit is configured to provide an output signal of the fourth latch.

4. The apparatus of claim 3, wherein the first circuit and the second circuit are logic NAND circuits, and
   wherein pulse widths of the first and second output pointer signals are equal to one clock cycle, and
   wherein the first input pointer signal and the second input pointer signal have a pulse width substantially equal to half the clock cycle.

5. The apparatus of claim 1, further comprising a third circuit coupled to the first and second circuits and configured to combine outputs of the first and second circuit to provide an output signal.

6. The apparatus of claim 5, wherein the first circuit, the second circuit and the third circuit are logic NAND circuits.

7. The apparatus of claim 1, wherein the phases of the first, second, third and fourth input pointer signals and the first and second output pointer signals are controlled to cause the first, second, third and fourth latches and the first and second circuits to perform a first-in first-out (FIFO) operation on the input signal.

8. An apparatus comprising:
a first plurality of FIFO circuits configured to receive a plurality of corresponding bits of data, a first input pointer signal, a second input pointer signal and a first output pointer signal, and further configured to provide a plurality of corresponding bits of first latched data responsive to the first input pointer signal, the second input pointer signal and the first output pointer signal;
a second plurality of FIFO circuits configured to receive the plurality of corresponding bits of data and a third input pointer signal, a fourth input pointer signal and a second output pointer signal, and further configured to provide a plurality of corresponding bits of second latched data responsive to the third input pointer signal, the fourth input pointer signal and the second output pointer signal; and
a data bus inversion (DBI) calculator circuit configured to receive the plurality of corresponding bits of the first latched data and the plurality of corresponding bits of the second latched data, and further configured to provide a current DBI calculation result signal,
wherein each FIFO circuit of the first plurality of FIFO circuits includes:
an input circuit configured to receive a corresponding bit of the data and the first and second input pointer signals, and further configured to latch the corresponding bit of the data responsive to the first input pointer signal and the second input pointer signal to provide a corresponding bit of the first latched data;
a bit inverter configured to receive the corresponding bit of the first latched data and the current DBI calculation result signal, and configured to provide the corresponding bit of the first latched data with or without inversion as a bit inverter output signal responsive to the current DBI calculation result signal; and
a logic circuit coupled to the bit inverter, and configured to provide the bit inverter output signal responsive to the first output pointer signal.

9. The apparatus of claim 8, wherein the input circuit includes:
a first latch circuit configured to receive the corresponding bit of the data and the first input pointer signal, configured to latch the corresponding bit of the data responsive to the first input pointer signal and further configured to provide the latched corresponding bit;
a multiplexer configured to receive a control code, the latched corresponding bit of the data from the first latched circuit and a latched next bit to the corresponding bit of the data from another first latch circuit of another FIFO circuit of the first plurality of FIFO circuits, and further configured to select either the latched corresponding bit of data or the latched next bit to the corresponding bit of data responsive to the control code and to provide the selected bit; and
a second latch circuit configured to receive the selected bit of the data from the multiplexer and further configured to latch the selected bit of the data from the multiplexer responsive to the second input pointer signal.

10. The apparatus of claim 9, further comprising a lane remap control logic circuit configured to provide the control code to the multiplexer.

11. The apparatus of claim 10, wherein the control code is indicative of a defective path coupled to one of the first plurality of FIFO circuits.

12. The apparatus of claim 8, wherein the logic circuit includes a NAND circuit configured to provide the bit inverter output signal responsive to the first output pointer signal in an active state.

13. The apparatus of claim 12, wherein the first output pointer signal has an active pulse indicative of being in the active state and has a pulse width substantially equal to one clock cycle, and wherein the first input pointer signal and the second input pointer signal have a pulse width substantially equal to half the clock cycle.

14. The apparatus of claim 8, wherein the DBI calculator circuit is configured to perform DBI calculation to detect whether the majority bits of current data are different in logic level from previous data, and
wherein the DBI calculator circuit is configured to provide the current DBI calculation result signal as a previous DBI calculation result signal responsive to the second output pointer signal.

15. An apparatus comprising:
a data bus inversion (DBI) circuit configured to receive a string of input data including first input data, second input data following the first input data and third input data following the second input data, and further configured to provide a string of output data including first output data and second output data following the first output data, the DBI circuit including:
a first circuit including:
a first plurality of first latch circuits on a first plurality of lanes configured to latch the first input data responsive to a first input pointer signal;
a first plurality of second latch circuits on the first plurality of lanes configured to latch a first selected data responsive to a second input pointer signal; and
a first plurality of logic circuits on the first plurality of lanes configured to provide the first output data responsive to a first output pointer signal;
a second circuit including:
a second plurality of first latch circuits on a second plurality of lanes configured to latch the second input data responsive to a third input pointer signal;
a second plurality of second latch circuits on the second plurality of lanes configured to latch a second selected data responsive to a fourth input pointer signal; and
a second plurality of logic circuits on the second plurality of lanes configured to provide the second output data responsive to a second output pointer signal; and
a DBI calculator circuit configured to perform first DBI calculation on the latched first selected data and the latched second selected data responsive to the second latch circuit latching the first selected data and the second latch circuit latching the second selected data, respectively.

16. The apparatus of claim 15, wherein each logic circuit of the first plurality of logic circuits on the first plurality of lanes includes a bit converter configured to receive a result signal indicative of the first DBI calculation, and further configured to invert the first selected data responsive to the result signal.

17. The apparatus of claim 15, wherein the first selected data is the latched first input data and the second selected data is the latched second input data.

18. The apparatus of claim 15, wherein the first circuit further comprises a lane remapping circuit, the lane remapping circuit comprising:
   a plurality of multiplexers comprising:
      a first multiplexer on a first lane of the first plurality of lanes; and
      a second multiplexer on a second lane of the first plurality of lanes,
   wherein the first multiplexer is configured to receive a latched first bit of the first input data from a first latch circuit of the first plurality of first latch circuits on the first lane and a latched second bit of the first input data from another first latch circuit of the first plurality of first latch circuits on the second lane, the first multiplexer further configured to receive a control code, and
   wherein the first multiplexer is configured to provide either the latched first bit or the latched second bit to the second latch circuit on the first lane responsive to the control code.

19. The apparatus of claim 18, further comprising a lane remap control logic circuit configured to provide the control code indicative of a defective lane, if any, in the first plurality of lanes coupled to a corresponding multiplexer among the plurality of multiplexers.

20. The apparatus of claim 19, wherein the first plurality of lanes includes a DBI lane including:
   a DBI latch circuit coupled to a DBIchip port configured to receive a DBI bit indicating whether the data bus inversion is executed on the input data; and
   a logic circuit coupled to a data redundancy port,
   wherein the lane remapping circuit is configured to provide the DBI bit to the data redundancy port if the control code is indicative of no defective lane.

* * * * *